US005482817A

United States Patent [19]
Dichiara et al.

[11] Patent Number: 5,482,817
[45] Date of Patent: Jan. 9, 1996

[54] MID AND DEEP-UV ANTIREFLECTION COATINGS AND METHODS FOR USE THEREOF

[75] Inventors: Robert R. Dichiara, Middletown; Christopher F. Lyons, LaGrangeville; Ratnasabapathy Sooriyakumaran, Fishkill; Gary T. Spinillo, Wappingers Falls; Kevin M. Welsh, Fishkill; Robert L. Wood, Poughkeepsie, all of N.Y.

[73] Assignee: International Business Machines Corporation, Armonk, N.Y.

[21] Appl. No.: 315,318

[22] Filed: Sep. 29, 1994

Related U.S. Application Data

[62] Division of Ser. No. 17,938, Feb. 16, 1993, Pat. No. 5,401,614, which is a division of Ser. No. 55,400, May 3, 1993, Pat. No. 5,380,621, which is a division of Ser. No. 845,404, Mar. 3, 1992, abandoned.

[51] Int. Cl.[6] ............................................. G03C 5/00
[52] U.S. Cl. ........................... 430/271.1; 430/270.14; 430/272.1; 430/323; 522/6; 522/904
[58] Field of Search ............................ 430/271, 270, 430/272, 323; 522/904, 6

[56] References Cited

U.S. PATENT DOCUMENTS

| | | | |
|---|---|---|---|
| 3,642,480 | 2/1972 | Vrancker | 96/48 |
| 4,008,083 | 2/1977 | Pye | 350/160 |
| 4,137,365 | 1/1979 | Wydeven et al. | 428/412 |
| 4,362,809 | 12/1982 | Chen et al. | 430/312 |
| 4,370,405 | 1/1983 | O'Toole et al. | 430/312 |
| 4,405,707 | 9/1983 | Bierhenke et al. | 430/281 |
| 4,491,628 | 1/1985 | Ito et al. | 430/176 |
| 4,515,886 | 5/1985 | Yamaoka et al. | 430/270 |
| 4,529,685 | 7/1985 | Borodovsky | 430/311 |
| 4,587,203 | 5/1986 | Brault et al. | 430/325 |
| 4,592,993 | 6/1986 | Ohnishi | 430/325 |
| 4,609,614 | 9/1986 | Pampalone et al. | 430/323 |
| 4,623,609 | 11/1986 | Harita et al. | 430/325 |
| 4,644,025 | 2/1987 | Sakaeami | 526/261 |

(List continued on next page.)

FOREIGN PATENT DOCUMENTS

| | | | |
|---|---|---|---|
| 0159428 | 4/1984 | European Pat. Off. | G03F 7/02 |
| 0264650 | 4/1984 | European Pat. Off. | G03F 7/02 |

OTHER PUBLICATIONS

Lessor, et al. *IBM Tech. Discl. Bulletin*, vol. 20, No. 11B, Apr. 1978.
O'Toole, et al. *IEEE*, "Linewwidth Control in Projection Lithography Using a Multilayer Resist Process", vol. Ed–28, No. 11, Nov. 1981.
Brewer, et al., *J. Apl. Photogr. Eng.*, "The Reduction of the Standing Wave Effect in Positive Photoresists" 184–186, vol. 7, No. 6, 1981.
Lin, et al., *J. Appl. Phys.* "Improvement of Linewidth Control With Anti–Reflective Coating in Optical Lithography" 1110–1115, 1984.
R. West, *J. Organomet. Chem.* "The Polysilane high Polymers" 300, 327 (1986).
Horn, *Solid State Technology*, "Antireflection Layers and Planarization for Microlithography", 57–62, 1991.
L. Schlegel, et al., *J. Vac. Sci. Technol.*, "Determination of Acid Diffusion in Chemical Amplification Positive Deep ultraviolet Resists", B9, 278 *(1991)*.
Dudley, et al., *Proc. Spie*, "Enhancement of Deep UV Patterning integrity and Process Control Using Antireflective Coating", 1672, 638 (1992).
Zhang, et al., "Organosilane Polymers:—Diphenylsilyene—" Journal of Polymer Science, Polymer Letters, Ed. vol. 23, No. 9, Sep. 1985, pp. 479–485.

*Primary Examiner*—Mark Chapman
*Attorney, Agent, or Firm*—Dale M. Crockatt

[57] ABSTRACT

An antireflective coating composition (ARC) for use with chemically amplified photoresist compositions comprising a polymer composition which is highly absorbent to mid and deep UV radiation, which is substantially inert to contact reactions with a chemically amplified photoresist composition, and which is insoluble in the developer for the chemically amplified photoresist composition.

9 Claims, 1 Drawing Sheet

OTHER PUBLICATIONS

| | | | |
|---|---|---|---|
| 4,746,596 | 5/1988 | Yoshioka et al. | 430/325 |
| 4,758,305 | 7/1988 | Bonifield et al. | 156/643 |
| 4,759,990 | 7/1988 | Yen | 428/421 |
| 4,761,464 | 8/1988 | Zeigler | 528/30 |
| 4,782,009 | 11/1988 | Bolon et al. | 430/326 |
| 4,822,718 | 4/1989 | Latham et al. | 430/271 |
| 4,855,199 | 8/1989 | Bolon et al. | 430/18 |
| 4,871,646 | 10/1989 | Hayase et al. | 430/192 |
| 4,910,122 | 3/1990 | Arnold et al. | 430/313 |
| 5,057,399 | 10/1991 | Flaim et al. | 430/299 |
| 5,110,697 | 5/1992 | Lamb et al. | 430/18 |
| 5,126,289 | 6/1992 | Ziger | 437/231 |
| 5,234,990 | 8/1993 | Flaim et al. | 524/609 |
| 5,271,803 | 12/1993 | Yen | 156/645 |
| 5,380,621 | 1/1995 | Dichiara et al. | 430/272 |
| 5,401,614 | 3/1995 | Dichiara et al. | 430/270 |

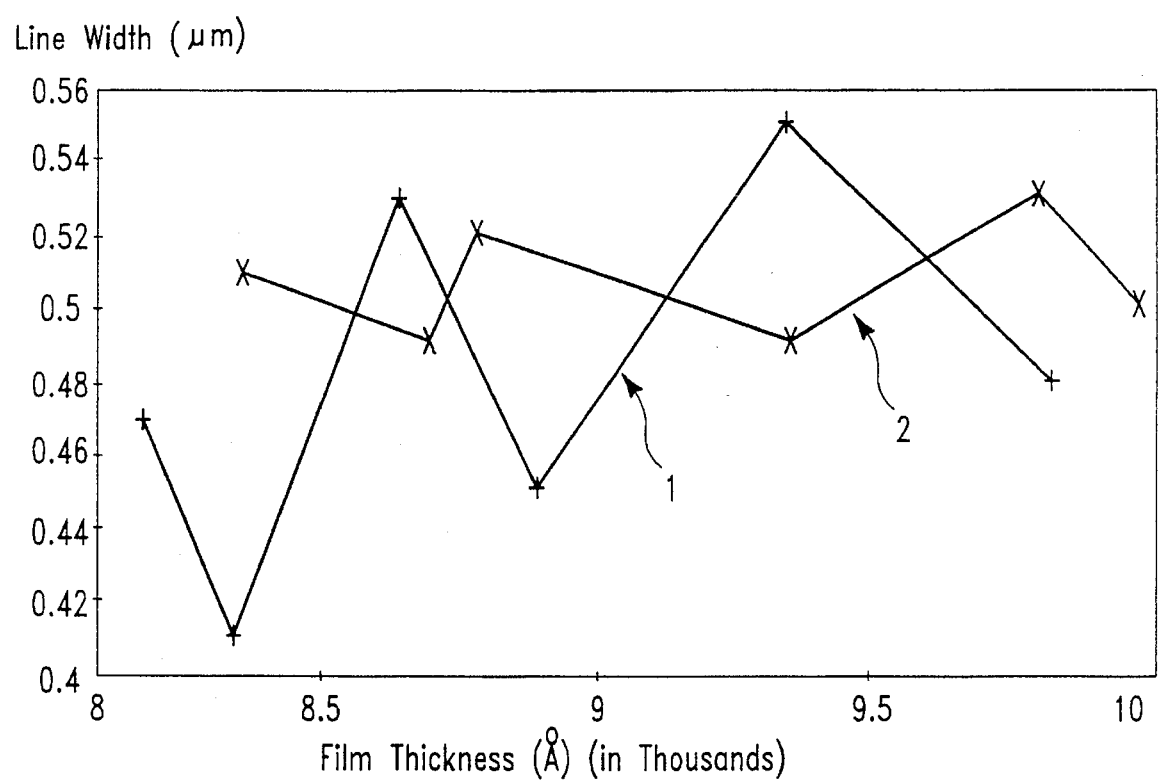

MID AND DEEP-UV ANTIREFLECTION COATINGS AND METHODS FOR USE THEREOF

RELATED APPLICATION

This application is a division of U.S. patent application Ser. No. 08/017,938 now U.S. Pat. No. 5,401,614 which is a division of U.S. patent application Ser. No. 08/055,400 now U.S. Pat. No. 5,380,621, filed May 3, 1993, which is a division of Ser. No. 07/845,404, filed Mar. 3, 1992, entitled "Mid and Deep UV Antireflection Coatings and Methods for Use Thereof," abandoned.

FIELD OF INVENTION

The present invention is directed to antireflective coating compositions for use with chemically amplified photoresist compositions. More particularly, the invention is directed to film forming compositions which are highly absorbent to mid and/or deep UV radiation and which are insoluble in the chemically amplified photoresist compositions and the developers therefor. The invention also provides methods for forming photoresist images having improved linewidth control.

BACKGROUND

As semiconductor manufacturers have sought to be able to fabricate devices having a higher degree of circuit integration to improve device performance, it has become necessary to use photolithographic techniques using shorter wavelengths in the mid and deep UV spectra to achieve fine features. In the process of making the desired very fine patterns many optical effects are experienced which lead to distortion or displacement of images in the photoresist that are directly responsible for wiring line width variations, opens and shorts, all of which can lead to deteriorated device performance. Many of these optical effects are attributable to substrate geometry and reflectivity influences that include halation and other reflected light scattering effects which may be due to uneven topography or the varying (wavelength dependent) reflectivity of the substrates and wires or layers being patterned thereon to define the desired features. Such effects are further exacerbated by both the non-uniformity of the photoresist film and film thickness. These effects are manifested in lithographic patterns uneven line width, often with "reflective notching", due to standing wave phenomena, non-vertical pattern sidewalls.

U.S. Pat. No. 4,910,122 to Arnold et al. is directed to processes for overcoming the reflectivity problems experienced in thin film lithography used in the fabrication of circuits of increasing density or integration. The process uses an antireflective film composition comprising a polymer having low surface energy (and which may incorporate a dye compound) as a layer interposed between the substrate and the imaging layer which reduces the dilatory reflective effects and which is removable by the photoresist developer.

It has been discovered that such processes are not compatible with chemically amplified resist compositions. Chemically amplified photoresist compositions are those in which the reaction continues through a mechanism that involves image formation of photoacid production and secondary acid production affects. An example of such composition is found in U.S. Pat. No. 4,491,628 to Ito et al. The codevelopable antireflective coatings adversely react with the components of the photoresist.

SUMMARY OF THE INVENTION

The present invention provides an antireflective coating composition (ARC) for use with chemically amplified photoresist compositions comprising a polymer composition which is highly absorbent to mid and/or deep UV radiation, and which is substantially inert to contact reactions with a chemically amplified photoresist composition, and which is insoluble in the developer for the chemically amplified photoresist composition.

The polymer composition used in the ARC is selected from the group consisting of polysilanes which strongly absorb in the mid and deep UV spectra and polyvinyl aromatic compositions which strongly absorb deep UV radiation which form a discrete underlayer, which are immiscible with the photoresist, and which are not removable during normal wet development of the photoresist. The polyvinyl aromatic compositions may farther be either cross-linkable or not, and when cross-linkable, cross-linked in use or not. In order to effectively protect against image distortion, the ARC should have an absolute optical density of at least 0.25 through the range of wavelengths from 235 to 280 nm. Since relatively thin coatings contribute to the ease in running a process free of side effects, it is preferred to employ material exhibiting an optical density of at least 2.0 µm to overcome lithographic variations due to reflectivity.

BRIEF DESCRIPTION OF THE DRAWING

The FIGURE is a plot showing a comparison of line width variations of composition with and without the antireflective coating compositions of the invention.

DESCRIPTION OF THE PREFERRED EMBODIMENT

According to the invention antireflective coating compositions (ARCs) are provided for use with chemically amplified photoresist compositions. These polymer compositions are characterized by being highly absorbent to mid and deep UV radiation, by being substantially inert to contact reactions with a chemically amplified photoresist composition, and by being substantially insoluble in the developer for the chemically amplified photoresist composition.

The polymer composition used in the ARC is selected from the group consisting of polysilanes and cross-linkable polyvinyl aromatic compositions which form a discrete underlayer, which are immiscible with the photoresist, and which are not removable during normal wet development of the photoresist. In order to effectively protect against image distortion, the ARC film should have an absolute optical density of at least 0.25 through the range of wavelengths from 235 to 280 nm. Such thin films are easy to apply, do not change the exposure setup (depth of focus etc) and may be facilely removed after processing. The films may remain in the structure or be removed dependent on the process ground rules.

It has been found that lithographic patterns are substantially improved by the incorporation of the mid and deep UV ARC of the present invention in lithographic processes. The control of line width variations due to standing wave effects over the uneven topography of underlying reflective features is achieved by the absorbance of the ARC of imaging wave lengths. The pattern profiles obtained are essentially vertical neither the "feet" (a protrusion from bottom of sidewall into line area) observed in conventional lithography nor the "flairs" (a non vertical sidewall or severe foot) seen with low surface energy polymer coating. As an additional benefit, the ARC of the present invention provides a chemical barrier between chemically amplified photoresist and silicon substrates. These benefits are due to the lack of solubility of the ARC in the solvents for the chemically amplified photoresists and the immiscibility of the ARC in the photoresist composition. The chemical barrier effects are also important when imaging over less reflective titanium nitride (TIN), silicon nitride ($Si_3N_4$) and TEOS (tetraethylorthosilicate). Such materials are extremely sensitive to environmental influences and the ARC of the invention functions as a barrier layer to provide quite useful protection against enviromental contaminants which results in extended process latitude.

EXAMPLE 1

A mixture of cyclohexylmethyldichlorosilane (54.75 g, 0.277 mol) and diphenyldichlorosilane (17.55 g, 0.069 mol) was added rapidly to dispersed sodium (45.4 g, 40% mineral oil, 0.79 mol) in a refluxing mixture of toluene (375 ml) and diglyme (40 ml). After the addition, the mixture was refluxed for one hour and allowed to cool to room temperature. At this point, isopropyl alcohol (75 ml) was added slowly to quench any unreacted sodium and the copolymer formed was precipitated into isopropyl alcohol (2 l). The solid was gravity filtered, air dried and extracted with toluene (500 ml). The toluene extract was washed with water (3×250 ml) and dried over anhydrous sodium sulfate. Evaporation of the solvent gave 10.24 grams of copolymer: poly(cyclohexylmethylsilane-co- diphenylsilane) having an optical density of 2.4 μm.

The copolymer was dissolved in toluene to form a 10% by weight solution. After filtration, a thin film of the copolymer was deposited on the surface of a silicon wafer by spin casting at 3000 rpm for 30 seconds. The coated wafer was soft-baked at 90° C. for 60 seconds leaving a film of 0.3 μm thickness exhibiting an optical density at 248 nm of 0.72.

A deep-UV chemically amplified photoresist comprising a partially t-butyloxycarbonyloxy substituted poly(p-hydroxystyrene) i.e., poly(p-hydroxystyrene-co-p-t-butyloxycarbonyloxystyrene) and a photoacid generator, trifluoromethylsulfonyloxybicyclo[2.2.1]-hept-5-ene-2,3-dicarboximide in a casting solvent propylene glycol monomethyl ether acetate (PM acetate) was applied as a 1.0 μm thick film to the surface of the silicon wafer, which had been coated with the antireflection material, by spin casting at 3200 rpm for 30 seconds, followed by a 90° C./60 second soft-bake. The ARC-photoresist coated wafer was then exposed to the output of a KrF laser (5 mJ/cm$^2$) through suitable optics and reticle. The exposed wafer was baked at 90° C. for 90 seconds, allowed to cool and finally developed by immersion in 0.24N tetramethylammonium hydroxide (TMAH)/water solution.

The development removed the photoresist composition, but not the ARC layer. The pattern may be further transferred through the ARC layer to the substrate using $CF_4$ reactive ion etch (RIE).

EXAMPLE 2

A crosslinkable poly(cyclotetramethylenesilane) made using the synthesis provided by R. West in *J. Organomet. Chem.*, 300, 327 (1986) may be coated onto silicon wafers to a thickness of about 2.0 μm as was done with the ARC of Example 1.

Thereafter, the treated wafer maybe overcoated with the deep UV photoresist composition as set forth in Example 1 to a thickness of about 1.0 μm. The photoresist maybe imaged using a KrF laser and is developed with 0.24N TMAH. The image maybe transferred through the ARC with $CF_4$ RIE.

EXAMPLE 3

Poly(2-vinylnaphthalene), 2.0 grams, available commercially (Aldrich Chemical: 19,193-0; Monomer-Polymer: 7668) was dissolved in xylene (98 grams). The solution was cast upon a bare silicon wafer at a spin speed of 2400 rpm for 30 seconds. The coated wafer was then baked at 90° C. for 60 seconds yielding polymeric film with a thickness of 0.05 μm exhibiting an optical density at 248 nm of 0.26.

The deep UV chemically amplified photoresist composition of Example 1 was applied to the ARC-coated silicon wafer as a 1.0 μm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE. There was some evidence of undercutting of the image profiles.

EXAMPLE 4

Poly(2-vinylnaphthalene) having an optical density of about 5.2 μm, 1.76 grams, available commercially (Aldrich Chemical: 19,193-0; Monomer-Polymer 7668), and 240 mg of 2,6-bis(4-azidobenzylidene)- 4-methylcyclohexanone (DABMC) were added to 98 grams of xylene. The solution, upon spin coating on a silicon wafer at 2400 rpm, yielded a polymeric film with a thickness of 0.05 μm. The coated wafer was then hard-baked at 180° C. for 90 seconds to yield cross-link the polymeric film with an optical density at 248 nm of 0.26.

The deep UV chemically amplified photoresist composition of Example 1 was applied to the ARC-coated silicon wafer as a 1.0 μm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE.

EXAMPLE 5

A solution comprised of 0.93 grams poly-( 2-vinyl-naphthalene), 0.07 grams 2,6-bis(4-azidobenzylidene)- 4-phenylcyclohexanone (DABPC) and 49 grams xylene was prepared and filtered to 0.2 μm. The solution was cast on a spinning silicon wafer (2400 rpm for 30 seconds). The coated wafer was baked at 180° C. for 90 seconds leaving a 0.05 μm thick crosslinked film exhibiting an optical density at 248 nm of 0.27.

The deep UV chemically amplified photoresist composition of Example 1 was applied to the ARC-coated silicon wafer as a 1.0 μm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE.

EXAMPLE 6

Poly(1-vinylnaphthalene) was purchased commercially (Monomer-Polymer: 8170). A 4% solids solution was prepared by adding 1.8 grams polymer and 0.2 grams DABMC to 48 grams xylene. Spin coating on a bare silicon wafer at 3000 rpm followed by a post apply bake at 180° C. for 90 seconds resulted in a 0.1 µm thick film with an optical density at 248 nm of 0.5.

The deep UV chemically amplified photoresist composition of Example 1 was applied to the ARC-coated silicon wafer as a 1.0 µm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE.

EXAMPLE 7

Poly(acenaphthylene) is commercially available from Monomer-Polymer (8675). A 4% solution in xylene yields, upon spin casting at 3000 rpm and soft-baking at 90° C. for 60 seconds, a 0.1 µm film with an optical density at 248 nm of 0.6.

The deep UV chemically amplified photoresist composition of Example 1 was applied to the ARC-coated silicon wafer as a 1.0 µm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE.

EXAMPLE 8

Poly(4-vinylbiphenyl) is commercially available from Aldrich Chemical (18,254-0). To 95 grams of xylene were added 0.6 grams DABPC and 4.4 grams polymer. After filtration a thin film of the polymeric mixture was deposited on a silicon wafer by spin coating at 4000 rpm for 30 seconds. The coated wafer was baked at 200° C. for 2 minutes to yield a 0.15 µm thick film with an optical density at 248 nm of 1.6.

The deep UV chemically amplified photoresist composition of Example 1 was applied to the ARC-coated silicon wafer as a 1.0 µm thick coating in the manner described in Example 1. The coated wafer was imaged with a KrF laser (5 mJ/cm$^2$), subjected to a post exposure bake (PEB) at 90° C. for 90 seconds, and developed by immersion in 0.24N TMAH. The pattern was further transferred through the ARC with $O_2$ RIE.

EXAMPLE 9

The lithographic performance of the deep-UV chemically amplified photoresist composition of Example comprising a partially poly(p-hydroxystyrene-co-p-t-butyloxycarbonyloxystyrene) and trifluoromethylsulfonyloxybicyclo[2.2.1]-hept-5-ene- 2,3-di-carboximide in a PM acetate casting solvent was evaluated over a number of substrates using the crosslinked poly-(2-vinylnaphthalene)/DABMC ARC of Example 4 compared to photoresist alone.

TABLE I

| Substrate | Performance |
| --- | --- |
| Silicon (HMDS)[1] | flair |
| Brewer CD-3[2] | occasional undercut |
| Brewer CD-5[2] | vertical profile |
| Brewer Omni-Layer[2] | severe footing |
| Hard-baked TNS[3] | severe footing |
| Hard-baked TNS[3] (with ARC) | vertical profile |
| Silicon nitride | foot |
| Silicon nitride (with ARC) | vertical profile |
| Titanium nitride | severe footing |
| Titanium nitride (with ARC) | vertical profile |
| Hard baked KTFR[4] | foot |
| TEOS[5] | foot |
| TEOS[5] (with ARC) | vertical profile |

[1]HMDS = hexamethyldisilazane
[2]from Brewer Science, Inc.
[3]TNS = a diazonaphthoquinone novolak resist
[4]KTFR = Kodak Thin Film Resist
[5]TEOS = tetraethylorthosilicate

EXAMPLE 10

Two sets of silicon wafers were used to show the benefits of the ARC of the invention. A control series of wafers was coated with the deep UV chemically aplified photoresist shown in Example 1. The wafers were patterned with a Canon excimer stepper (0.37 NA). All lines had a nominal width of 0.5 µm.

The line width variation with respect to film thickness is shown in Table II and is plotted as 1 in the FIGURE.

TABLE II

| Film Thickness (Å) | Linewidth (µm) |
| --- | --- |
| 8183 | 0.47 |
| 8352 | 0.41 |
| 8635 | 0.53 |
| 8886 | 0.45 |
| 9342 | 0.55 |
| 9822 | 0.48 |

In a similar manner a set of wafers was first coated with 0.06 µm of the ARC of Example 4 of the current invention using the processing conditions specified therein. Then the wafers were over coated with chemically amplified deep UV photoresist as above. The results are shown in Table III and as 2 in the FIGURE.

TABLE III

| Film Thickness (Å) | Linewidth (µm) |
| --- | --- |
| 8356 | 0.51 |
| 8689 | 0.49 |
| 8772 | 0.52 |
| 9352 | 0.49 |
| 9790 | 0.53 |
| 9973 | 0.50 |

It can be seen that the line width variations are greatly reduced by including the ARC of the present invention in the processing.

Although this invention has been described with respect to specific embodiments, the details thereof are not to be construed as limitations, for it will become apparent that various embodiments, changes and modifications may be resorted to without departing from the spirit and scope thereof, and it is understood that such equivalent embodiments are intended to be included within the scope of this invention.

We claim:

1. An antireflective coating composition for use with chemically amplified photoresist compositions comprising a polymer selected from the group consisting of poly(vinylnaphthalenes), poly(acenaphthalenes) and poly(vinylbiphenyls), which is highly absorbent to mid and/or deep UV radiation, which is substantially inert to contact reactions with a chemically amplified photoresist composition, and which is insoluble in the developer for the chemically amplified photoresist composition.

2. A photoresist structure having at least two layers and overlaying a semiconductor substrate comprising an antireflective first layer coated upon said substrate wherein the antireflective layer comprises a polymer selected from the group consisting of poly(vinylnaphthalenes), poly(acenaphthalenes) and poly(vinylbiphenyls), wherein said layer has an optical density of at least 2.0 µm at the imaging wavelength of an overlaying photoresist layer, and wherein the antireflective layer is substantially inert to contact reactions with the photoresist layer, and wherein the antireflective layer is insoluble in the developer for the photoresist layer, and a second layer coated upon said antireflective first layer comprising a chemically amplified photoresist which is sensitive to ultraviolet radiation having a wavelength in the range from about 180 nm to about 350 nm.

3. The photoresist structure of claim 2 wherein the antireflective first layer has an optical density of at least 2.0 µm over the range of wavelengths from about 235 nm to 280 nm.

4. The photoresist structure of claim 2 wherein the antireflective first layer is chemically non-reactive with the photoresist second layer.

5. The photoresist structure of claim 2 wherein the antireflective first layer is immiscible with the photoresist second layer.

6. The photoresist structure of claim 2 wherein the antireflective first layer is essentially insoluble in photoresist casting solvents selected from the group consisting of alcohols, esters, ethers, ketones.

7. The photoresist structure of claim 2 wherein the antireflective first layer comprises a poly(vinylnaphthalene).

8. The photoresist structure of claim 2 wherein the antireflective first layer comprises a poly(acenaphthalene).

9. The photoresist structure of claim 2 wherein the antireflective first layer comprises a poly(vinylbiphenyl).

* * * * *